United States Patent [19]

Dingwall

[11] 3,973,139
[45] Aug. 3, 1976

[54] LOW POWER COUNTING CIRCUITS

[75] Inventor: Andrew Gordon Francis Dingwall, Somerville, N.J.

[73] Assignee: RCA Corporation, New York, N.Y.

[22] Filed: May 23, 1973

[21] Appl. No.: 363,255

[52] U.S. Cl. ............................ 307/225 C; 307/205; 307/214; 307/251; 307/269
[51] Int. Cl.² ............... H03K 23/02; H03K 17/60; H03K 19/08; H03K 19/40
[58] Field of Search ............... 307/205, 214, 221 C, 307/225 C, 251, 255, 279, 304, 269; 58/23 A, 23 BA, 50 R

[56] References Cited
UNITED STATES PATENTS

| | | | |
|---|---|---|---|
| 3,716,723 | 2/1973 | Heuner et al. | 307/255 X |
| 3,720,841 | 3/1973 | Suzuki | 307/251 X |
| 3,737,673 | 6/1973 | Suzuki | 307/221 C X |
| 3,745,371 | 7/1973 | Suzuki | 307/221 C |
| 3,749,937 | 7/1973 | Rogers | 307/251 X |

*Primary Examiner*—John S. Heyman
*Assistant Examiner*—L. N. Anagnos
*Attorney, Agent, or Firm*—H. Christoffersen; Henry I. Schanzer

[57] ABSTRACT

A counter stage comprising a static inverter and first and second dynamic inverting means. Each inverting means includes an input, an output, and means for selectively rendering the inverting means operative. The output of the first inverting means is applied to the input of the static inverter, the output of the static inverter is applied to the input of the second inverting means and the output of the second inverting means is fed back to the input of the first inverting means. When one inverting means is rendered operative, the other inverting means is rendered inoperative.

10 Claims, 4 Drawing Figures

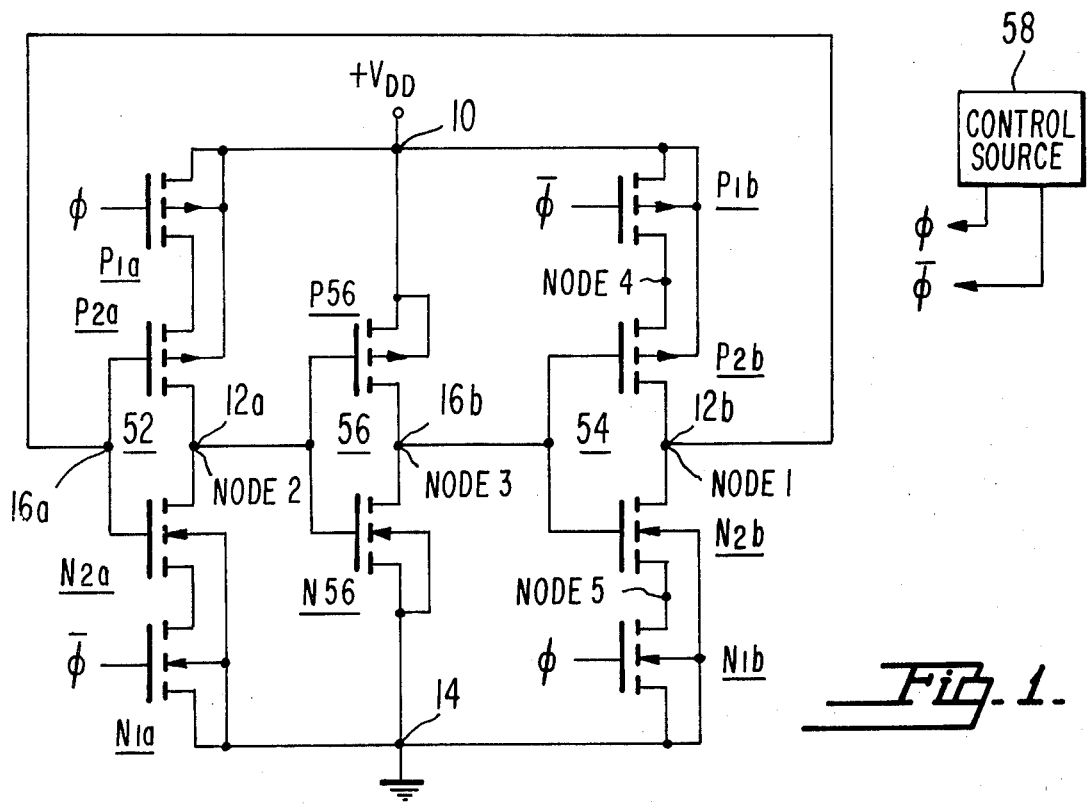
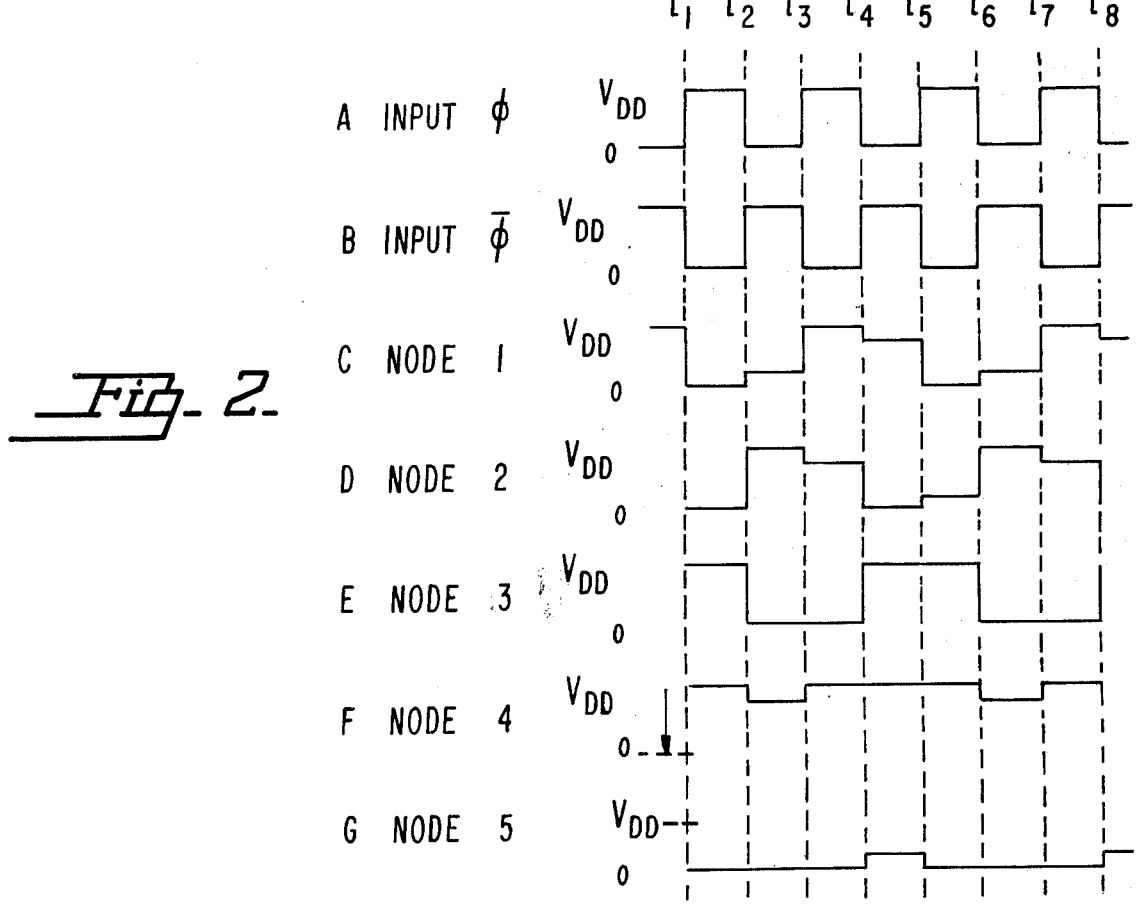

LOW POWER COUNTING CIRCUITS

This invention relates to counting circuits exhibiting very low power dissipation, relatively high speed, and reliable operation at low power supply voltages.

Some of the known prior art counting circuits exhibiting low power consumption use inverters and transmission gates, with the transmission gates being normally connected between the output of one inverter and the input to another inverter. There is, relatively speaking, considerable capacitance associated with the input and output of the transmission gates which must be charged and discharged whenever the applied signal changes state. To achieve high speed of operation, the transmission gate capacitances must be charged and discharged as quickly as possible. To meet this requirement, the impedances of the conduction paths of the inverters connected to the transmission gates must be minimized. However, every time an inverter is clocked or switched a current flows between the positive and negative power supply terminals during the transition time from one conduction state to another. Therefore, lowering the impedance of the inverters increases the amplitude of the transient currents and consequently increases the power dissipation. Also, the power dissipation is proportional, in part, to the capacitance at each node and, therefore, the capacitances associated with the transmission gates increase the average power dissipation.

In circuits embodying the invention the need for transmission gates is eliminated. Furthermore, the effective impedance of the conduction path of the inverting circuits is higher than in prior art circuits of the type described above.

Circuits embodying the invention include an inverter and two inverting means. Each inverting means includes an input, an output, and means for selectively powering the inverting means. The inverter is coupled between the output of one of the inverting means and the input of the second inverting means, and the output of the second inverting means is connected to the input of said one inverting means. Means are provided for powering only one of said first and second inverting means at a time.

In the accompanying drawings like components are denoted by like reference characters; and FIG. 1 is a schematic diagram of a binary circuit embodying the invention, FIG. 2 is a diagram illustrating the waveforms present at various nodes of the circuit of FIG. 1;

Figure 3:
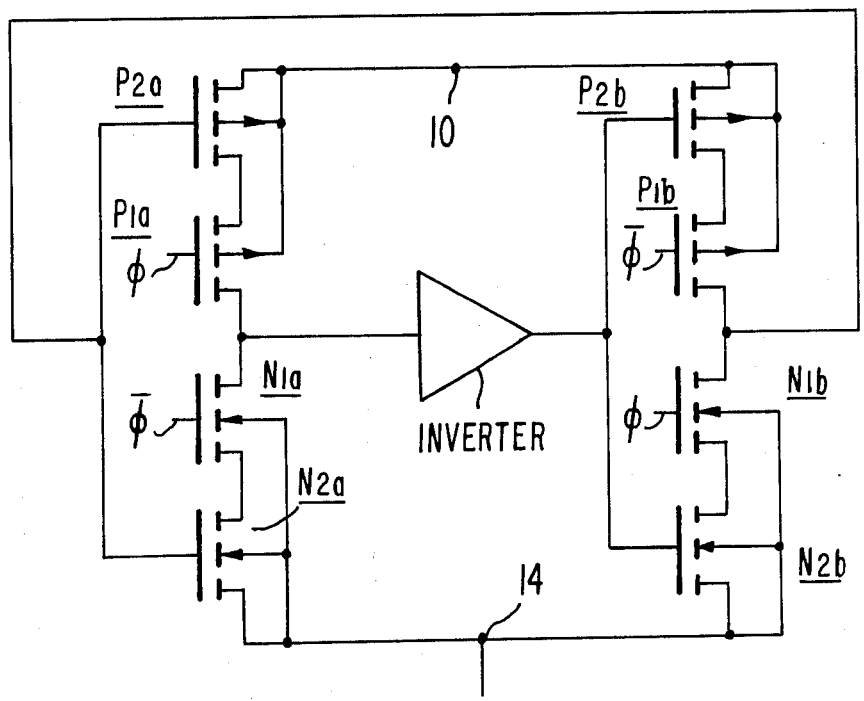
FIG. 3 is a schematic diagram of another embodiment of the invention.

The active devices preferred for use in practicing the invention are those of a class known in the art as insulated gate field effect transistors (IGFETS). For this reason, the circuits are illustrated in the drawings as employing such transistors, and will be so described hereinafter. However, this is not intended to preclude the use of other suitable devices, and to this end, the term "transistor" when used without limitation in the appended claims, is used in a generic sense.

An insulated gate field effect transistor may be either a P-type conductivity device or an N-type conductivity device. In the drawings a P-type device is indicated by an arrow pointing away from the body of the device and is denoted with the letter P, and an N-type device is indicated by an arrow pointing towards the body of the device and is denoted with the letter N. In this application a "static inverter" is defined as an inverter to which an operating potential is continuously applied and a "dynamic" or "clocked" inverter is defined as an inverter to which an operating potential is supplied or applied, intermittently.

In the circuit of FIG. 1 there is shown a binary dividing circuit which includes two clocked inverting means (52 and 54) controlled by clock pulses $\phi$ and $\bar{\phi}$ and a static complementary inverter 56. Inverting means 52, 54 and inverter 56 are connected in parallel between terminals 10 and 14. A positive potential of $+V_{DD}$ volts is applied to terminal 10 and ground potential (zero volts) is applied to terminal 14. Inverting means 52 includes transistor P1a connected at its source electrode to terminal 10 and at its drain electrode to the source electrode of transistor P2a. The drain electrode of transistor P2a is connected to the drain electrode of transistor N2a and to the gate electrodes of transistors P56 and N56 at output terminal 12a. The source electrode of transistor N2a is connected to the drain electrode of transistor N1a and the source electrode of transistor N1a is connected to terminal 14. The source electrodes of transistors P56 and N56 are connected to terminals 10 and 14, respectively. The drain electrodes of transistors P56 and N56 are connected to the gate electrodes of transistors P2b and N2b at input terminal 16b.

The conduction path of transistor P1b is connected in series with the conduction path of transistor P2b between terminal 10 and output terminal 12b. The conduction path of transistor N2b is connected in series with the conduction path of transistor N1b between output terminal 12b and terminal 14. Output terminal 12b is connected to the input terminal 16a, of inverter 52. Terminals 12b, 12a and 16b are also denoted as nodes 1, 2 and 3, respectively. The junction of transistors P1b and P2b is denoted as node 4 and the junction of transistor N1b and N2b is denoted as node 5.

The substrates (indicated by an arrow pointing away from the body of the devices) of the P-type conductivity transistors are connected to terminal 10 to which is applied the most positive ($+V_{DD}$) circuit potential, and the substrates (indicated by an arrow pointing towards the body of the devices) of the N-type conductivity transistors are connected to terminal 14 to which is applied the most negative circuit potential.

Clock pulses $\phi$ and $\bar{\phi}$ having the characteristics shown in waveforms A and B, respectively, of FIG. 2 are applied to the inverting means from a source 58. Clock pulse $\phi$, is applied to the gate electrodes of transistors P1a and N1b and the complement $\bar{\phi}$ of this clock pulse is applied to the gates of transistors N1a and P1b. These clock pulses may be generated by any one of a multiplicity of well known clock generators. The pulses $\phi$ and $\bar{\phi}$ may also be any one of a multiplicity of periodic or aperiodic signals which are to be counted.

The oeration of the circuit may be described best by referring to the waveforms of FIG. 2 and going through one full cycle of the clock.

From time $t1$ and $t2$ the clock $\phi$ is high and $\bar{\phi}$ is low. For this clock condition transistors N1b and P1b are fully turned on and the operating potential ($V_{DD}$ and ground) is applied across the conduction paths of transistors P2b and N2b. That is, the source electrodes of transistors P2b and N2b are coupled through the low "on" impedance of switching transistors P1*b* and N1*b*, respectively, to $+V_{DD}$ and ground, respectively. During this time interval inverting means 54 produces at its output 12*b* the inverse of the signal present at its input 16*b*. Thus, assuming the signal at 16*b* to be high (see waveform E of FIG. 2) the signal at 12*b* goes low (see waveform C of FIG. 2). That is, for a high level at input 16*b* transistor N2*b* is turned on and transistor P2*b* is turned off. The series conduction paths of transistors N2*b* and N1*b* provide a relatively low impedance path discharging the output 12*b* toward ground potential. The low level may be assumed to be approximately equal to ground potential and the high level may be assumed to be approximately equal to $+V_{DD}$. The low level at terminal 12*b* is fed back to the input 16*a* of inverting means 52. But, when $\phi$ is high and $\bar{\phi}$ is low, transistors P1*a* and N1*a* are turned off and transistors P2*b* and N2*a* are decoupled from the operating potential. As a result, inverting means 52 does not respond to the signal at its input and its output floats, remaining charged to the signal level (assumed to be low, see waveform D of FIG. 2) present at 12*a* just prior to time *t*1. Thus, during the one half cycle from time *t*1 and *t*2 inverting means 54 can change state in response to a signal present at its input. But, inverting means 52 does not change state and cannot respond to a changed input signal condition.

At time *t*2 the clock $\phi$ goes from high to low and $\bar{\phi}$ goes from low to high. Transistors N1*a* and P1*a* are turned on and the conduction paths of transistors P2*a* and N2*a* are now coupled between $+V_{DD}$ and ground, respectively. Concurrently, transistors P1*b* and N1*b* are switched off and transistors P2*b* and N2*b* are disconnected at their source electrodes from $+V_{DD}$ and ground, respectively.

For the clock condition existing from time *t*2 to time *t*3 inverting means 52 is responsive to the low level signal at its input and produces a high level signal (see waveform D) at its output which is applied to the input of static inverter 56. The high level applied to the input of inverter 56 turns off transistor P56 and turns on transistor N56, causing the signal applied to the input, 16*b*, of inverter 54 to go low (see waveform E). However, inverting means 54 is now decoupled from the operating potential and is not responsive to the change in level at its input. Accordingly, the level at output 12*b* remains low (see waveform C). The output of inverting means 54 remains low until time *t*3 at which time inverting means 54 is powered and capable of producing a change at its output.

The outputs of inverting means 52 and 54 thus vary at one half the rate of the $\phi$ and $\bar{\phi}$ clock. For every two cycles of the $\phi$ and $\bar{\phi}$ clocks there is produced but one cycle at each of the inverters 52, 54, and 56. The circuit thus divides or counts by two. The outputs of inverters 52 and 56 are complementary and the output of inverter 54 is phase shifted by 270° with respect to the output of inverter 52. The outputs of inverters 52 and 56 can, for example, be used to provide complementary clock signals to a subsequent counter or divider stage.

Waveforms F and G depict the potential at nodes 4 and 5 of inverting means 54. These waveforms indicate that there is no appreciable voltage drop across the switching transistors (P1*a*, N1*a*, P1*b*, N1*b*), resulting in negligible power dissipation by these devices. Furthermore, the potential at nodes 4 and 5 does not change very much. For example, as described above, from time *t*1 to *t*2 inverter 54 is "powered" and its input is a high level. Transistor P1*b* is turned on charging node 4 to $+V_{DD}$ volts. Concurrently, transistors N2*b* and N1*b* conduct and the potential at nodes 1 and 5 are substantially at ground. At time *t*2 power is removed from inverting means 54 (transistors P1*b*, N1*b* are switched off) and output 12*b* (node 1) floats. Concurrently at time *t*2 inverting means 52 is powered and in response to the low level at node 1 produces a "high" at node 2. The high at node 2 causes the production of a "low" signal at node 3. The low signal at node 3 is in a direction to turn on transistor P2*b* and turn off transistor N2*b*. Recall that just prior to time *t*2 the source of transistor P2*b* is charged to $+V_{DD}$ volts. When transistor P2*b* is turned on there is a redistribution of charge between nodes 1 and 4 as shown in waveforms C and F for the time *t*2 to *t*3. The potential at node 1 increases by an amount equal to the decrease in potential at node 4. As may be seen from the waveforms, the potential change at the nodes is a small fraction of $V_{DD}$. In a circuit being tested, the amplitude of the change was observed to vary between ¼ and ⅓ of $V_{DD}$. Therefore, when at time *t*3 transistor P1*b* is switched on, not much charge is needed to recharge node 4 to $+V_{DD}$. Therefore, the power dissipation associated with charging and discharging node 4 is very small.

In a similar manner it can be shown that the potential at node 5 is periodically driven slightly positive when transistors P1*b* and N1*b* are switched off and there is a high "floating" output present at node 1 and a high input applied to node 3 (16*b*). But here again, the potential at node 5 does not swing between $V_{DD}$ and ground but by a small fraction thereof. Thus, here again when transistor N1*b* is switched on not much charge is needed to discharge node 5 to ground, resulting in very little power dissipation.

The voltage swings at the nodes of inverter means 52 are the same as those of inverter 54. These inverting means thus consume very little power and can operate at relatively high speed since there are no large potential swings across the nodal capacitances.

It should be appreciated that in the circuit of FIG. 1 the output of each inverter 52, 54 and 56 is connected to only two gate electrodes. Thus, each inverter drives only the gate or input capacitance of the inverter to which it is connected. Therefore, the capacitive load is much smaller than in prior art circuits where the junction capacitance of transmission gate transistors as well as the gate capacitance of the succeeding inverter is connected to or reflected to the output of the inverter. Thus, the capacitance is minimized. The power dissipation (P) of this type of circuit may be expressed mathematically, to a first approximation, as $P=CV^2f$, where $C$ is the node capacitance, $V$ is the potential change across $C$ and $f$ is the frequency of operation. Obviously, lowering $C$ decreases the power dissipation.

It should also be appreciated that for the inverting means 52, 54, the conduction paths of four transistors are connected in series between the two power supply terminals. Thus, when the inverter means are switched from one conduction state to another, even if all four transistors are on for some short transient period, the current during the transition period is lower than in prior art circuits due to the series impedance of four conduction paths.

Furthermore, the effective impedance of the conduction paths is increased due to the substrate bias effect as described below. Recall that the substrates of all the P-type transistors are connected in common to the most positive potential (terminal 10) and that the substrates of all the N-type transistors are connected in common to the most negative potential (terminal 14). For example, when transistors P1a and P2a conduct, the source of transistor P2a is at a slightly lower potential than $V_{DD}$ due to the voltage drop across the conduction path of transistor P1a. However, the substrate of P2a is at $+V_{DD}$. Accordingly, there is a slight reverse bias between the source and substrate of transistor P2a. This reverse bias increases the impedance of the transistor, thereby minimizing further the power dissipation of the circuit. This same condition occurs for transistor P2b when transistors P1b and P2b are turned on. Similarly, a reverse bias condition exists between the source and substrate of transistor N2a when transistors N2a and N1a are turned on and similarly for transistor N2b when transistors N2b and N1b are turned on.

Although the FIG. 1 circuit operation has been described assuming regularly recurring clock pulses $\phi$ and $\bar{\phi}$, it should be understood that in other applications, e.g., an event counter, these signals may change aperiodically. The signals $\phi$ and $\bar{\phi}$ to any stage may be the outputs from node 2 and node 3 of the previous stage.

The circuit of FIG. 3 is similar to that of FIG. 1 except the position of the conduction path of the transistors is interchanged from that shown in FIG. 1. In FIG. 3 each one of the inverting transistors (P2a, N2a, P2b, N2b) is connected at its source electrode to a suitable power terminal and, at its drain to the source of a switching transistor (P1a, N1a, P1b, N1b). Each switching transistor is connected at its drain to the output node of its inverting means. The operation of the circuit is substantially the same for FIG. 1 and need not be described in detail.

Figure 4:
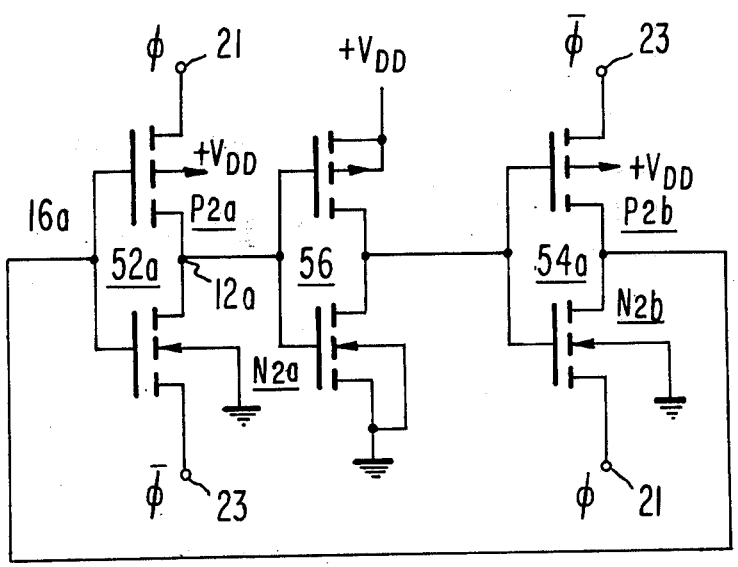
FIG. 4 is a schematic diagram of still another embodiment of the invention.

In FIG. 4 power is supplied to the inverting means 52a, 54a by means of complementary clock signals $\phi$ and $\bar{\phi}$. The source electrodes of transistors P2a and N2b are connected to a terminal 21 to which is applied a signal $\phi$ and the source electrodes of transistors N2a and P2b are connected to a terminal 23 to which is applied a signal $\bar{\phi}$. When $\phi$ is high and $\bar{\phi}$ is low, an operating potential is supplied to inverting means 52a and it is "powered" or "enabled." Inverting means 52a can then produce at its output 12a the inverse of the signal present at its input 16a. Concurrently, for this condition ($\phi$ = high, $\bar{\phi}$ = low) inverting means 54 is "disabled." Effectively there is no operating potential applied to it since $\phi$ and $\bar{\phi}$ are in a direction to render it inoperative. When $\phi$ is low and $\bar{\phi}$ is high inverting means 54a is rendered operative and inverting means 52a is rendered inoperative. The operation of the circuit is similar to that discussed above for FIGS. 1 and 3 and need not be detailed.

The invention has been illustrated using complementary switching transistors (P1a, N1a, P1b, N1b). But it should be evident that the two switching transistors of each inverting means could be of the same conductivity type. For example, transistor N1a could be replaced with a P-type conductivity transistor having its gate driven by the same signal or a signal in phase with the signal applied to the gate of transistor P1a. Similarly, transistor P1a could be replaced by an N-type transistor having its gate electrode driven by the same signal or a signal in phase with the signal applied to the gate of transistor N1a.

The invertor portion (P2a-N2a, P2b-N2b) of each inverting means has been illustrated using complementary transistors. But, transistors of single conductivity type could also be used to form the inverter portion of the inverting means. Accordingly, transistors of single conductivity type can be used to practice the invention.

What is claimed is:

1. The combination comprising:
   first and second selectively operative inverting means, each inverting means having a signal input terminal, a power input terminal means and an output;
   an inverter having an input connected to said output of said first inverting means, and having an output connected to said signal input terminal of said second inverting means;
   means connecting said output of said second inverting means to said signal input terminal of said first inverting means; and
   means for applying control signals to the power input terminal means of said first and second inverting means to render operative said first inverting means and render inoperative said second inverter during one time interval and for rendering inoperative said first inverting means and rendering operative said second inverting means during another time interval.

2. The combination comprising:
   first and second selectively operative inverter means, each having an input and an output;
   a continuously operative inverter having an input coupled to said output of said first inverter means, and having an output coupled to said input of said second inverter means;
   means coupling said output of said second inverter means to said input of said first inverter means; and
   means for rendering operative one of said first and second inverter means at a time.

3. The combination as claimed in claim 2 wherein each one of said first and second inverter means includes first and second transistors each having a control electrode and a conduction path, wherein the control electrodes of the two transistors of each one of said first and second inverter means are connected to said input of the first and second inverter means, respectively, and wherein the conduction paths of said first and second transistors of said first and second inverter means are coupled to said output of said first and second inverter means, respectively, for charging and discharging the respective said output, when said inverter means is rendered operative; and
   wherein each one of said first and second inverter means includes means for selectively applying an operating potential across the conduction paths of said first and second transistors.

4. The combination comprising;
   two power terminals for the application therebetween of an operating potential;
   first and second inverting means connected in parallel between said two power terminals; each inverting means having an input and an output and including a first switch means connected in series with a first controllable conduction means between one of said power terminals and said output and including a second switch means connected in series with a second controllable conduction means between the other one of said power terminals and said output;
   an inverter having an input and an output, the input of said inverter being connected to the output of said first inverting means and the output of said inverter being connected to the input of said second inverting means;

means connecting the output of said second inverting means to the input of said first inverting means; and means for applying signals to said switch means for during one time interval closing the two switch means of said first inverting means and opening the two switch means of said second inverting means and for during a second succeeding time interval opening the two switch means of said first inverting means and closing the two switch means of said second inverting means.

5. The combination as claimed in claim 4 wherein each one of said first controllable conduction means includes a first transistor having first and second electrodes defining the ends of a conduction path and a control electrode for controlling the conductivity of said path, each said first switch means being connected in series with the conduction path of the associated said first transistor;

wherein each one of said second controllable conduction means includes a second transistor having first and second electrodes defining the ends of a conduction path and a control electrode, each said second switch means being connected in series with the conduction path of the associated said second transistor; and wherein the control electrodes of said first and second transistors of each inverting means are connected to the input of that inverting means.

6. The combination as claimed in claim 5 wherein each one of said switch means is a switching transistor having a conduction path and a control electrode; and wherein said means for applying signals to said switch means includes means for applying signals to the control electrodes of said switching transistors.

7. The combination as claimed in claim 6 wherein one of the two switching transistors is of one conductivity type and the other one of the two switching transistors is of a second, complementary, conductivity type.

8. The combination as claimed in claim 6 wherein said first and second transistors of each inverting means are of complementary conductivity type and wherein each switching transistor is of the same conductivity type as the transistor to whose conduction path it is serially connected; and wherein said means for applying signals include means for applying complementary signals to the control electrodes of the switching transistors of an inverting means.

9. The combination as claimed in claim 8 wherein each one of said transistors is an insulated gate field effect transistor having a gate electrode and source and drain electrodes wherein said source electrode is said first electrode, said drain electrode is said second electrode and wherein said gate electrode is said control electrode; and wherein said inverter includes two transistors of complementary conductivity type having their conduction paths connected in series between said two power terminals.

10. The combination as claimed in claim 9 wherein said two transistors of said inverter are insulated gate field effect transistors.

* * * * *